(12) United States Patent
Cheng et al.

(10) Patent No.: US 10,884,343 B2
(45) Date of Patent: Jan. 5, 2021

(54) SYSTEM AND METHOD FOR MICRO-NANO MACHINING BY FEMTOSECOND LASER TWO-PHOTON POLYMERIZATION

(71) Applicant: South University of Science and Technology of China, Guangdong (CN)

(72) Inventors: Xing Cheng, Guangdong (CN); Dehu Cui, Guangdong (CN); Ziping Li, Guangdong (CN); Jing Ming, Guangdong (CN)

(73) Assignee: South University of Science and Technology of China, Guangdong (CN)

( * ) Notice: Subject to any disclaimer, the term of this patent is extended or adjusted under 35 U.S.C. 154(b) by 798 days.

(21) Appl. No.: 15/500,414

(22) PCT Filed: Oct. 22, 2014

(86) PCT No.: PCT/CN2014/089190
§ 371 (c)(1),
(2) Date: Apr. 11, 2017

(87) PCT Pub. No.: WO2016/015389
PCT Pub. Date: Feb. 4, 2016

(65) Prior Publication Data
US 2017/0212424 A1      Jul. 27, 2017

(30) Foreign Application Priority Data
Aug. 1, 2014 (CN) .......................... 2014 1 0375257

(51) Int. Cl.
*G03F 7/20* (2006.01)
*G03F 7/00* (2006.01)
(52) U.S. Cl.
CPC .......... *G03F 7/7055* (2013.01); *G03F 7/0037* (2013.01); *G03F 7/2053* (2013.01);
(Continued)

(58) Field of Classification Search
CPC ........... G03F 7/20; G03F 7/70; B23K 26/342; B23K 26/20
(Continued)

(56) References Cited

U.S. PATENT DOCUMENTS

| | | | |
|---|---|---|---|
| 5,739,898 A * | 4/1998 | Ozawa ................ | G03F 7/70125 355/53 |
| 6,455,233 B1 * | 9/2002 | Watt ...................... | G03F 7/2065 250/492.21 |

(Continued)

FOREIGN PATENT DOCUMENTS

| | | |
|---|---|---|
| CN | 1862354 | 11/2006 |
| CN | 101650446 A | 2/2010 |

(Continued)

OTHER PUBLICATIONS

Yang et al., Projection two-photon polymerization using a spatial light modulator, Optics Communications, 331 (2014) pp. 82-86.

(Continued)

*Primary Examiner* — Dana Ross
*Assistant Examiner* — Joseph W Iskra
(74) *Attorney, Agent, or Firm* — Barnes & Thornburg LLP; Jeffrey R. Stone (57) ABSTRACT

Disclosed are a system and method for micro-nano machining by femtosecond laser two-photon polymerization. The system includes: a femtosecond laser, an external light path modulation unit, an image capture apparatus, a focusing lens, a displacement platform, a computer and a monitoring apparatus, where the image capture apparatus is configured to capture cross-section graphs of a three-dimensional micro-nano device layer by layer, so that modulated femtosecond lasers form parallel beams arranged according to all layers of the cross-section graphs.

9 Claims, 6 Drawing Sheets

(52) U.S. Cl.
CPC ...... *G03F 7/70041* (2013.01); *G03F 7/70416* (2013.01); *G03F 7/70641* (2013.01)

(58) Field of Classification Search
USPC .......................................... 219/121.6–121.86
See application file for complete search history.

(56) References Cited

U.S. PATENT DOCUMENTS

| | | | |
|---|---|---|---|
| 2009/0314751 A1* | 12/2009 | Manens | H01L 31/022425 219/121.69 |
| 2010/0046349 A1* | 2/2010 | Nakano | G11B 7/00745 369/112.23 |
| 2010/0294749 A1* | 11/2010 | Kempe | B23K 26/046 219/121.72 |
| 2011/0300490 A1 | 12/2011 | Rachet et al. | |
| 2016/0231575 A1* | 8/2016 | Shoham | G03H 1/0005 |

FOREIGN PATENT DOCUMENTS

| | | |
|---|---|---|
| CN | 102000912 | 4/2011 |
| JP | 2003001599 | 1/2003 |
| KR | 20090117092 | 11/2009 |

OTHER PUBLICATIONS

Yang et al., Three Dimensional Micro-mechanical and Micro-optical Devices Fabricated by Holographic Two-Photon Lithography, NEMS2013, Suzhou, China, Apr. 7-10, 2013, pp. 641-644.

* cited by examiner

SYSTEM AND METHOD FOR MICRO-NANO MACHINING BY FEMTOSECOND LASER TWO-PHOTON POLYMERIZATION

The present application claims priority to a Chinese Patent application No. 201410375257.5, filed with SIPO on Aug. 1, 2014 by South University of Science and Technology of China, and entitled 'SYSTEM AND METHOD FOR MICRO-NANO MACHINING BY FEMTOSECOND LASER TWO-PHOTON POLYMERIZATION', the disclosure of which is incorporated herein by reference in its entirety.

TECHNICAL FIELD

The present disclosure relates to the technical field of micro-nano machining, and in particular relates to a system and method for micro-nano machining by femtosecond laser two-photon polymerization.

BACKGROUND

With the development of a semiconductor micro-electronic technology, various accompanied micro-nano machining technologies become important research contents of the modern science and technology and is widely applied in the fields of micro electromechanical systems, microphotonic devices, precision special instruments, an information technology, biomedicine and the like.

In recent years, with the development of a laser technology, a two-photon absorption technology using femtosecond lasers as a light source is introduced into the field of micro-nano machining. The technology utilizes the femtosecond lasers with longer wave length as the light source, laser beams are focused by a focusing objective lens on a light-sensitive material to be machined, and the light-sensitive material generates a polymerization reaction at a focal point through two-photon absorption action; however, two-photon absorption is not generated at other places of a light path due to lower laser intensity; meanwhile, a corresponding single-photon absorption process is not generated due to lower laser energy; and therefore, two-photon polymerization is only limited to the focal point. When the focal point of the lasers moves inside the light-sensitive material, the light-sensitive material is solidified along a track of the focal point, and the light-sensitive material which is not solidified is removed by an organic solvent, so as to realize the micro-nano machining for the light-sensitive material.

According to a principle of the micro-nano machining by femtosecond laser two-photon polymerization, the technology has a special advantage in the aspect of making any complex three-dimensional micro-nano structure. This is because in one hand, the light-sensitive material has a threshold effect for generating the two-photon absorption, and the reaction efficiency and the light intensity are in direct proportion; and in the other hand, only the light intensity of incident lasers at the local area of the focal point meets the threshold of the material for generating the two-photon absorption and the light-sensitive material is transparent relative to other places of the beam, and do not generate absorption. Therefore, fixed-point polymerization can be realized at any position inside the light-sensitive material, so that the process of the micro-nano machining by femtosecond laser two-photon polymerization has strict capability of spatial orientation, so as to make any complex three-dimensional micro-nano structure.

In an early stage, the micro-nano machining by femtosecond laser two-photon polymerization means that the three-dimensional micro-nano structure is formed through point-to-point two-photon polymerization inside the light-sensitive material. Therefore, the machining for one three-dimensional micro-nano device requires a large amount of point polymerization processes, the time is longer, the machining efficiency is low, and the process flow is not sufficient to meet industrial production demands, causing a limit to further application of the technology in the field of the micro-nano machining. In order to solve the above problems, researchers from various countries propose a method for multifocal parallel machining, so that hundreds of micro-nano structures are simultaneously and parallelly machined, thereby improving the machining efficiency a certain extent. Meanwhile, domestic researchers also make lots of researches in the aspect of the multifocal parallel machining technology. For example, a method for one-time completion of machining and assembly of parts by multi-beam combination and control is proposed, so as to solve the problem of micro-scale assembly.

However, the above method for multifocal parallel machining is more suitable for batch production of the micro-nano device with a periodic structure, but batch production of any complex three-dimensional device by the method is still highly difficult. The focal point of each beam in the machining process still needs to move along a pre-designed track point by point, the relative displacement of the focal point of the femtosecond lasers and the light-sensitive material is often realized by controlling the movement of a displacement platform, but the inertia of the displacement platform is greater, and the response time is longer. Therefore, the machining efficiency for any complex three-dimensional device is improved in a limited range by the existing method for multifocal parallel machining, and the high-precision mechanical positioning capability is required in a three-dimensional direction, increasing machining difficulty.

SUMMARY

In view of this, the present disclosure provides a system and method for micro-nano machining by femtosecond laser two-photon polymerization, so as to solve the technical problems proposed in the above background part.

In a first aspect, the present disclosure provides a system for micro-nano machining by femtosecond laser two-photon polymerization, including:

a femtosecond laser, configured to generate femtosecond lasers;

an external light path modulation unit, configured to modulate the femtosecond lasers;

an image capture apparatus, configured to capture cross-section graphs of a three-dimensional micro-nano device layer by layer, so that modulated femtosecond lasers form parallel beams arranged according to all layers of the cross-section graphs;

a focusing lens, configured to focus the parallel beams arranged according to all layers of the cross-section graphs in a light-sensitive material to form a planar graph composed of a plurality of focal points, where the light-sensitive material at all the focal points are solidified, so as to realize one-time projection forming for each layer of cross-section structures of the three-dimensional micro-nano device;

a displacement platform, configured to carry out fine adjustment for position of the light-sensitive material placed on the displacement platform;

a computer, configured to control the displacement platform and the image capture apparatus; and a monitoring apparatus, configured to monitor a micro-nano machining process for the light-sensitive material in real time.

In a second aspect, the present disclosure further provides a method for micro-nano machining by femtosecond laser two-photon polymerization, executed by the system for the micro-nano machining by femtosecond laser two-photon polymerization described in the first aspect, where the method is used for layer-by-layer micro-nano machining for a light-sensitive material, and a layer-by-layer micro-nano machining process for the light-sensitive material is monitored by the monitoring apparatus in real time, and the method includes:

opening the femtosecond laser to generate femtosecond lasers;

modulating the femtosecond lasers by the external light path modulation unit;

controlling, by the computer, the image capture apparatus to capture a first layer of cross-section graphs of the three-dimensional micro-nano device, so that the modulated femtosecond lasers form parallel beams arranged according to the first layer of cross-section graphs;

focusing, by the focusing lens, the parallel beams arranged according to the first layer of cross-section graphs in the light-sensitive material to form a planar graph composed of a plurality of focal points, where the light-sensitive material at all the focal points are solidified, so as to realize one-time projection forming for the first layer of cross-section structures of the three-dimensional micro-nano device;

controlling, by the computer, the displacement platform to move by a distance equal to thickness of one layer of the cross-section of the three-dimensional micro-nano device, where a movement direction of the displacement platform is parallel to a direction that the femtosecond lasers radiate the light-sensitive material; and controlling, by the computer, the image capture apparatus to capture remaining layers of cross-section graphs of the three-dimensional micro-nano device layer by layer; and controlling, by the computer after each layer of the cross-section structures is formed through machining, the displacement platform to move by a distance equal to thickness of one layer of the cross-section of the three-dimensional micro-nano device until the entire three-dimensional micro-nano device is completely machined.

In a third aspect, the present disclosure further provides a method for micro-nano machining by femtosecond laser two-photon polymerization, executed by the system for the micro-nano machining by femtosecond laser two-photon polymerization described in the first aspect, where the method is used for multifocal parallel micro-nano machining for a light-sensitive material to manufacture a plurality of three-dimensional micro-nano devices, and a multifocal parallel micro-nano machining process for the light-sensitive material is monitored in real time by the monitoring apparatus, and the method includes:

opening the femtosecond laser to generate femtosecond lasers;

modulating the femtosecond lasers by the external light path modulation unit;

controlling, by the computer, the image capture apparatus to enable one beam of modulated femtosecond lasers to become a plurality of beams of parallel femtosecond lasers;

focusing, by the focusing lens, the plurality of beams of parallel femtosecond lasers in the light-sensitive material to form a plurality of focal points, where the light-sensitive material at all the focal points are solidified, so as to obtain a structure at a first point of each three-dimensional micro-nano device; and controlling, by the computer, the displacement platform to move according to a preset track to carry out multifocal parallel micro-nano machining for the light-sensitive material until all the three-dimensional micro-nano devices are completely machined.

According to the system and method for the micro-nano machining by femtosecond laser two-photon polymerization, the image capture apparatus is arranged in a light path for the micro-nano machining by the femtosecond lasers, so that not only one beam of femtosecond lasers can be divided into a plurality of beams of parallel femtosecond lasers to realize simultaneous machining for a plurality of three-dimensional micro-nano devices, but also one-time projection forming for each layer of the cross-section graphs of the manufactured devices can be realized. Moreover, all layers of the cross-section graphs may be different. In this way, any complex three-dimensional micro-nano device can be machined, so as to greatly improve the machining efficiency and the process flow. Additionally, in the layer-by-layer micro-nano machining process, the displacement platform only needs to move along the direction of cross-section thickness of the micro-nano device and does not need to move point by point along the plane two-dimensional direction. In this way, the time for machining and forming for each layer of the cross sections of the three-dimensional micro-nano device is obviously shortened, the machining efficiency and the process flow are improved, and the positioning precision requirement in the plane two-dimensional direction is reduced, so that the machining process is simplified, and the difficulty is reduced.

BRIEF DESCRIPTION OF DRAWINGS

By reading the detailed descriptions made for non-restrictive embodiments with reference to the drawings below, other features, purposes and advantages of the present disclosure become more apparent.

DETAILED DESCRIPTION

The present disclosure will be further described in detail below in combination with drawings and embodiments. It may be understood that embodiments described herein are only used for explaining the present disclosure, rather than limiting the present disclosure. Additionally, it should be noted that, in order to facilitate description, only relevant parts, rather than all contents, of the present disclosure, are shown in the drawings.

Embodiment 1

Figure 1:
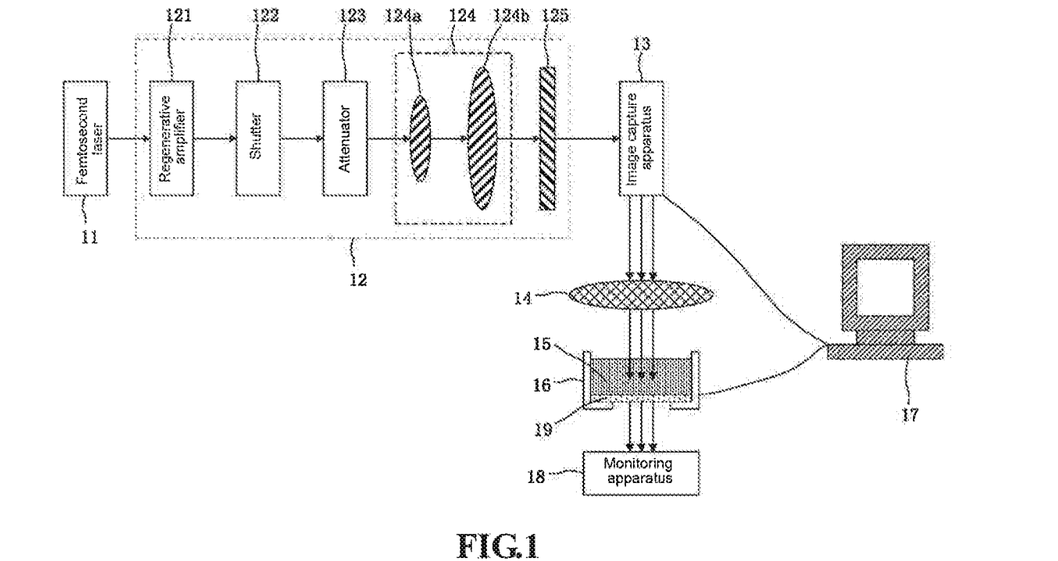
FIG. 1 is a schematic structural diagram illustrating a system for micro-nano machining by femtosecond laser two-photon polymerization provided by embodiment 1 of the present disclosure.

Embodiment 1 of the present disclosure provides a system for micro-nano machining by femtosecond laser two-photon polymerization. FIG. 1 is a schematic structural diagram illustrating the system for the micro-nano machining by femtosecond laser two-photon polymerization provided by the embodiment 1 of the present disclosure. As shown in FIG. 1, the system for the micro-nano machining by femtosecond laser two-photon polymerization includes: a femtosecond laser 11, configured to generate femtosecond lasers; an external light path modulation unit 12, configured to modulate the femtosecond lasers; an image capture apparatus 13, configured to capture cross-section graphs of a three-dimensional micro-nano device layer by layer, so that the modulated femtosecond lasers form parallel beams arranged according to all layers of the cross-section graphs; a focusing lens 14, configured to respectively focus the parallel beams arranged according to all layers of the cross-section graphs in a light-sensitive material 15 to form a planar graph composed of a plurality of focal points, where the light-sensitive material at all the focal points are solidified, so as to realize one-time projection forming for each layer of cross-section structures of the three-dimensional micro-nano device; a displacement platform 16, configured to carry out fine adjustment for the position of the light-sensitive material 15 placed on the displacement platform; a computer 17, configured to control the displacement platform 16 and the image capture apparatus 13; and a monitoring apparatus 18, configured to monitor a micro-nano machining process for the light-sensitive material 15 in real time.

It should be noted that, a glass slide 19 may be fixed on the displacement platform 16 and is configured to place the light-sensitive material 15. Additionally, the monitoring apparatus 18 may adopt a CCD (Charged Coupled Device) image sensor as a core part. In addition, a scanning array lens may also be arranged between the image capture apparatus 13 and the focusing lens 14, so that the machining speed is further improved since the response speed of the scanning array lens is higher.

It also should be noted that, the image capture apparatus 13 can be controlled by the computer 17 to form all layers of the cross-section graphs of the three-dimensional micro-nano device, and one beam of femtosecond lasers can form a plurality of beams of parallel femtosecond lasers arranged according to all layers of the cross-section graphs, so as to realize layer-by-layer micro-nano machining for the light-sensitive material; and accordingly, the displacement platform 16 only needs to move along cross-section thickness of the micro-nano device. More generally, the image capture apparatus 13 may also not form all layers of the cross-section graphs of the three-dimensional micro-nano device. At this time, the image capture apparatus 13 may only divide one beam of femtosecond lasers into a plurality of beams of parallel femtosecond lasers, so that multifocal parallel micro-nano machining is carried out on the light-sensitive material, so as to manufacture a plurality of micro-nano devices simultaneously; and accordingly, the displacement platform 16 moves according to a preset track, where the preset track is relevant to the distribution of all machining points of a micro-nano device to be manufactured.

In the present embodiment, further, the external light path modulation unit 12 includes but not limited to: a regenerative amplifier 121, a shutter 122, an attenuator 123, a collimating lens group 124 and an aperture stop 125 that are sequentially arranged on an advance path of the femtosecond lasers. The femtosecond lasers generated by the femtosecond laser 11 are ultra-short pulse lasers and need to be modulated by the external light path modulation unit 12 to realize the micro-nano machining for the light-sensitive material 15. The present disclosure relates to the multifocal parallel micro-nano machining; compared with mono-focal point-by-point machining, the required energy of the femtosecond lasers is greater; therefore, the regenerative amplifier 121 needs to amplify the energy of the femtosecond lasers; and the on-off state of the beams, the energy of which is amplified, is controlled by the shutter 122, and the size of the energy of the beams is adjusted by the attenuator 123. Through the control of the attenuator 123 on the beams, the central intensity at the focal point of each beam can be adjusted, so as to control the machining resolution. Then, the collimating lens group 124 is used, where the collimating lens group 124 includes a short-focus lens 124a and a long-focus lens 124b. Since the energy of the lasers is in gaussian distribution in space, the light intensity of the beams of the lasers is higher at the edges than the center; in order to reduce the difference of the light intensity of image capturing cross sections caused by non-uniform distribution of the light intensity of cross sections of the beams, the collimating lens group 124 needs to collimate and expand the beams, so that the distribution of the light intensity at the central area of the beams of the lasers is relatively uniform. Next, the aperture stop 125 is used for filtering the edges of the beams to obtain beams of femtosecond lasers with approximately uniform distribution of the light intensity of the cross sections.

It should be noted that, besides the above devices having modulating action for the femtosecond lasers, other devices may also be arranged on the advance path of the femtosecond lasers and in front of the image capture apparatus 13 according to the actual requirement. For example, in order that the structure of the system for the micro-nano machining is more compact, a whole reflector is arranged on the advance path of the femtosecond lasers and behind the aperture stop 125.

According to the system for the micro-nano machining by femtosecond laser two-photon polymerization provided by the embodiment 1 of the present disclosure, the image capture apparatus is arranged in a light path for the micro-nano machining by the femtosecond lasers, so that not only one beam of femtosecond lasers can be divided into a plurality of beams of parallel femtosecond lasers to realize simultaneous machining for a plurality of three-dimensional micro-nano devices, but also one-time projection forming for each layer of the cross-section graphs of the manufactured devices can be realized, and all layers of the cross-section graphs may be different. Therefore, any complex three-dimensional micro-nano device can be machined, so as to greatly improve the machining efficiency and the process flow. Additionally, in the layer-by-layer micro-nano machining process, the displacement platform only needs to move along the direction of cross-section thickness of the micro-nano device and does not need to move point by point along the plane two-dimensional direction. In this way, the time for machining and forming for each layer of the cross sections of the three-dimensional micro-nano device is obviously shortened, the machining efficiency and the process flow are improved, and the positioning precision requirement in the plane two-dimensional direction is reduced, so that the machining process is simplified, and the difficulty is reduced.

Based on the above principle, the system for the micro-nano machining by femtosecond laser two-photon polymerization may have various specific implementation manners. For example, the image capture apparatus may be a dynamic image capture apparatus or a static image capture apparatus, and different devices may be selected for different image capture apparatus to realize the micro-nano machining. No matter which is chosen, the image capture apparatus can not only enable one beam of femtosecond lasers to be divided into a plurality of beams of parallel femtosecond lasers, but also realize one-time projection forming for each layer of the cross-section graphs of the three-dimensional micro-nano device to be manufactured. The implementation manners will be described in detail below.

Embodiment 2

Embodiment 2 of the present disclosure also provides a system for micro-nano machining by femtosecond laser two-photon polymerization. Based on the embodiment 1, the dynamic image capture apparatus is adopted as the image capture apparatus of the present embodiment.

In the present embodiment, the step of controlling, by a computer 17, the image capture apparatus includes: the structure of a three-dimensional micro-nano device is modeled by the computer, and a model obtained through modeling is converted into digital voltage signals to load on the dynamic image capture apparatus by the computer, so as to form all layers of cross-section graphs of the three-dimensional micro-nano device. Specifically, the computer 17 can realize computer aided design by a software control unit arranged in the computer 17, a three-dimensional model is established for the three-dimensional micro-nano device to be machined, the established three-dimensional model is divided into a plurality of layers of cross-section graphs, and each layer of the cross-section graphs is decomposed point by point to obtain a corresponding layer of cross-section graphs, which is composed of a plurality of points. It should be noted that, optionally, aided design software in the above software control unit may be selected from the existing commercial software, such as CAD (Computer Aided Design), where optionally, a CAD file may be in an STL (Standard Template Library) file format.

Further, the dynamic image capture apparatus includes a plurality of pixel units, where the pixel units, which are in the opening state under the control of the computer, form all the layers of the cross-section graphs of the three-dimensional micro-nano device on the dynamic image capture apparatus.

Still further, each pixel unit of the dynamic image capture apparatus is separately opened or closed under the control of the computer; and when the femtosecond lasers are radiated on the dynamic image capture apparatus, each pixel unit in an opening state reflects or transmits the femtosecond lasers, so that one beam of femtosecond lasers is divided into a plurality of beams of femtosecond lasers arranged according to the specific shape to realize the micro-nano machining.

Specifically, a first layer of cross-section graphs of the model of the three-dimensional micro-nano device designed by the software control unit of the computer is converted into the digital voltage signals, then the digital voltage signals are loaded on the dynamic image capture apparatus, and each signal controls one pixel unit. When the femtosecond lasers are radiated on the dynamic image capture apparatus, the digital voltage signals control every pixel unit to be opened or closed, a plurality of transmitted or reflected beams arranged according to the first layer of cross-section graphs can be formed, and a first layer of cross-section structures of the device is formed through machining; a second layer of cross-section graphs of the model of the device is converted into digital voltage signals, the digital voltage signals are loaded on the dynamic image capture apparatus, a plurality of transmitted or reflected beams arranged according to the second layer of the cross-section graphs can be formed, and a second-layer cross-section structure of the device is formed through machining; and successively, the entire three-dimensional micro-nano device is finally obtained by layer-by-layer polymerization.

In the present embodiment, an LCD (Liquid Crystal Display) or a DLP (Digital Light Procession) may be adopted as the dynamic image capture apparatus, where the LCD and the DLP belong to an SLM (Spatial Light Modulator).

Next, how the dynamic image capture apparatus respectively adopts the LCD and the DLP to divide one beam of femtosecond lasers into a plurality of beams of femtosecond lasers is further described.

Figure 2A:
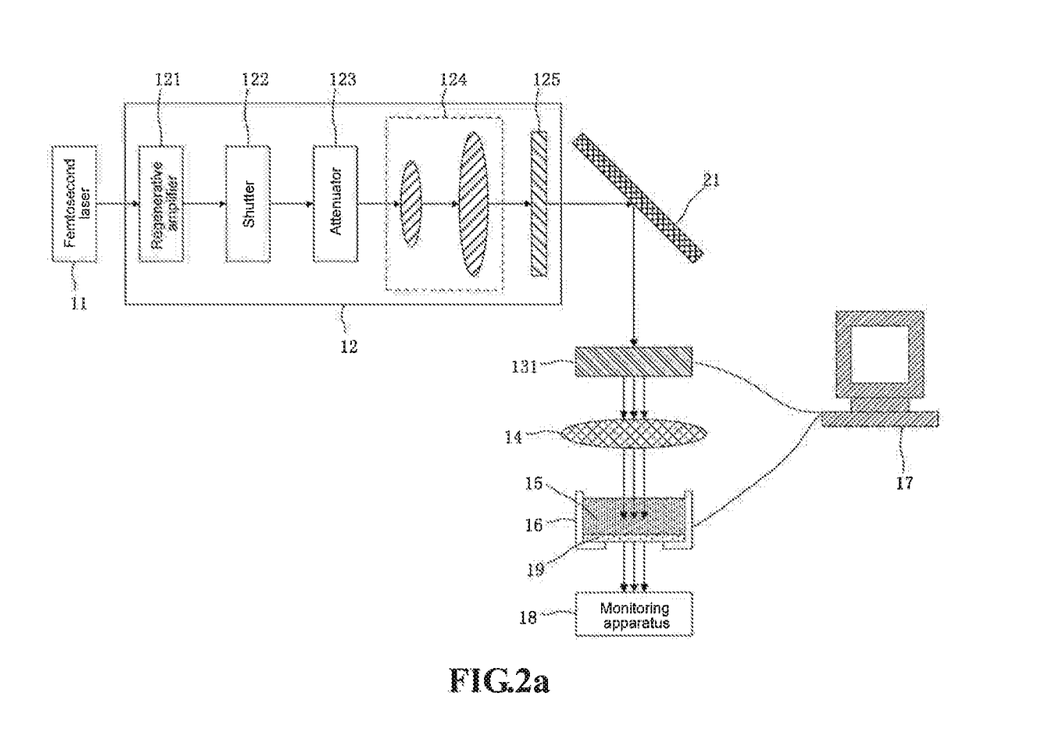
FIG. 2a is a schematic structural diagram illustrating a system for micro-nano machining by femtosecond laser two-photon polymerization provided by embodiment 2 of the present disclosure.

FIG. 2a is a schematic structural diagram illustrating a system for micro-nano machining by femtosecond laser two-photon polymerization provided by the embodiment 2 of the present disclosure. In FIG. 2a, an LCD 131 is adopted as the dynamic image capture apparatus, and in order that the structure of the whole system for the micro-nano machining is more compact, a whole reflector 21 is arranged on an advance path of the femtosecond lasers and between the aperture stop 125 and the LCD 131. Specifically, each pixel unit of the LCD 131 is composed of a box containing liquid crystal materials, and each pixel unit can be separately opened or closed under the control of the computer 17. When the light source of the femtosecond lasers are radiated on the LCD 131, the opened pixel unit on the LCD 131 can transmit the femtosecond lasers, and the closed pixel unit can not transmit the femtosecond lasers. A plurality of controllable transmission beams can be formed by controlling the opening/closing state of each liquid crystal box (pixel unit), a planar graph composed of a plurality of focal points is formed in a light-sensitive material after focusing, and the light-sensitive material at all the focal points generate two-photon polymerization to form a cross-section structure of one layer in a specific shape.

Figure 2B:
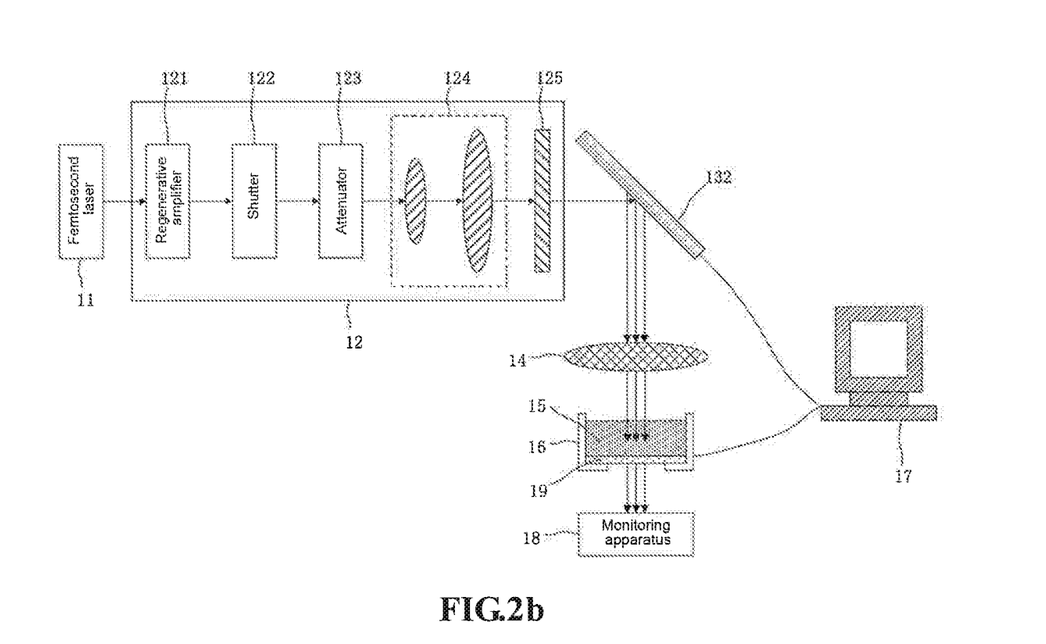
FIG. 2b is a schematic structural diagram illustrating another system for micro-nano machining by femtosecond laser two-photon polymerization provided by the embodiment 2 of the present disclosure.

FIG. 2b is a schematic structural diagram illustrating another system for micro-nano machining by femtosecond laser two-photon polymerization provided by the embodiment 2 of the present disclosure. In FIG. 2b, a DLP 132 is adopted as the dynamic image capture apparatus. Specifically, a core part of the DLP 132 is a DMD (Digital Micro-mirror Device), where the DMD is composed of thousands of inclinable tiny lenses, one lens is one pixel unit, each lens can be inclined by 12 degrees to two sides, and incident light is reflected out from two directions. Each pixel unit can be separately opened or closed under the control of the computer 17; and when the light source of the femtosecond lasers is radiated on the DMD, the lens in the opening state reflects the incident light into a machining light path to participate the machining process, while the lens in the closing state reflects the incident light out of the machining light path, and then the incident light is absorbed by a light absorber. A plurality of controllable transmission beams can be formed by controlling the opening/closing state of each lens, a planar graph composed of a plurality of focal points is formed in the light-sensitive material after focusing, and the light-sensitive material at all the focal points generate two-photon polymerization to form a first layer of cross-section structures in a specific shape.

Figure 3A:
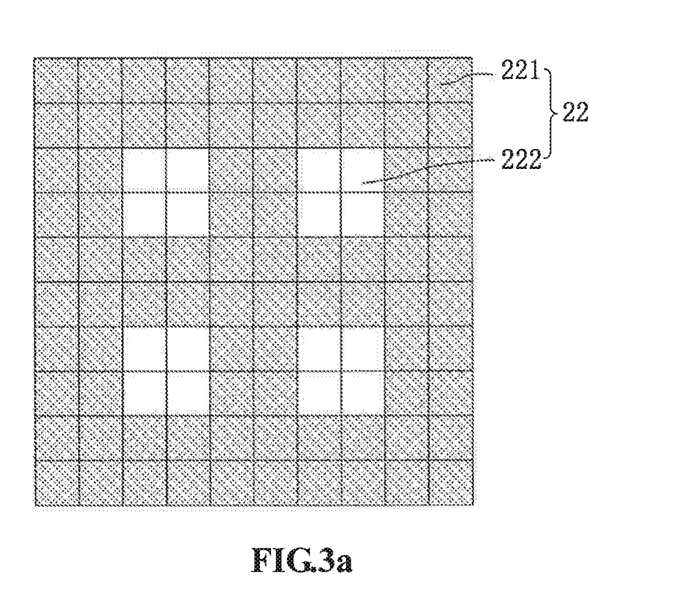
FIG. 3a is a local schematic structural diagram illustrating a dynamic image capture apparatus used for simultaneously machining four micro-nano devices provided by the embodiment 2 of the present disclosure.

Next, firstly, it should be considered that the dynamic image capture apparatus is only used for dividing one beam of femtosecond lasers into a plurality of beams of parallel femtosecond lasers. FIG. 3a is a local schematic structural diagram illustrating a dynamic image capture apparatus used for simultaneously machining four micro-nano devices provided by the embodiment 2 of the present disclosure. As shown in FIG. 3a, in the local structure of the dynamic image capture apparatus (which may be an LCD panel or a DMD), each square region is one pixel unit 22, and each pixel unit 22 can be separately opened or closed under the control of the computer 17. Firstly, the dynamic image capture apparatus is controlled according to machining requirements, pixel units 221 with shadows represent that the pixel units are in the closing state, and pixel units 222 without shadows represent that the pixel units are in the opening state.

Specifically, in micro-nano machining, when the femtosecond lasers are radiated on the dynamic image capture apparatus after being modulated by an external light path modulation unit 12 firstly, only the pixel units 222 in the opening state can transmit or reflect the femtosecond lasers to form four parallel beams, where each beam of femtosecond lasers is composed of four beams transmitted or reflected by the pixel unit 222 in the opening state. Four light spots are formed inside the light-sensitive material 15 after focusing by a focusing lens 14, and the light-sensitive material at the light spots generate two-photon polymerization. The computer 17 controls a displacement platform 16 to move according to a preset track, the four micro-nano devices can be simultaneously and parallelly machined, and the whole machining process can be monitored by a monitoring apparatus 18 in real time. The scanning array lens may also be arranged between the dynamic image capture apparatus and the focusing lens 14, and the scanning array lens can project the femtosecond lasers into the light-sensitive material 15, so that the machining speed is further improved since the response speed of the scanning array lens is higher.

It should be noted that, one beam of femtosecond lasers can be transmitted or reflected by a plurality of pixel units 222 in the opening state, where the shape of the pixel units 222 in the opening state can be square or rectangular. Additionally, in an actual application, the quantity, the intensity, the shape, the interval and the distribution of the parallel beams can be controlled by choosing the dynamic image capture apparatus with different resolutions and flexibly controlling the opening/closing state of each pixel unit therein, so as to control the quantity, the minimum machining size, the interval and the distribution of the parallelly machined devices, so that the machining speed is greatly improved, and the technological flexibility is very strong. Meanwhile, the opening and closing switching speed of each pixel unit is as high as microseconds, thereby being conductive to further improving the machining speed and flexibly controlling the exposure time, so as to improve the machining resolution. The quantity of the pixel units of the LCD or the DLP as the dynamic image capture apparatus can be millions, thereby easily realizing thousands of beams of light spots and realizing large-scale parallel exposure, so as to simultaneously machine thousands of micro-nano devices.

Figure 3B:
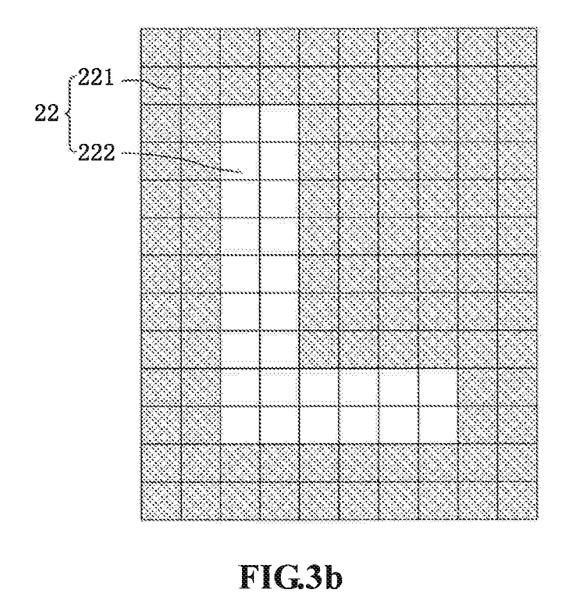
FIG. 3b is a local schematic structural diagram illustrating a dynamic image capture apparatus used for machining an L-shaped device provided by the embodiment 2 of the present disclosure.

Next, it should be further considered that, the dynamic image capture apparatus is used for layer-by-layer micro-nano machining. FIG. 3b is a local schematic structural diagram illustrating a dynamic image capture apparatus used for machining an L-shaped device provided by the embodiment 2 of the present disclosure. As shown in FIG. 3b, as in FIG. 3a each square region is one pixel unit 22, and each pixel unit 22 can be separately opened or closed under the control of the computer 17. Firstly, the SLM as the dynamic image capture apparatus is controlled according to machining requirements, pixel units 221 with shadows represent that the pixel units are in the closing state, and pixel units 222 without shadows represent that the pixel units are in the opening state. Additionally, in FIG. 3b, the pixel units 222 in the opening state form a graph of the L-shaped device.

Figure 3C:
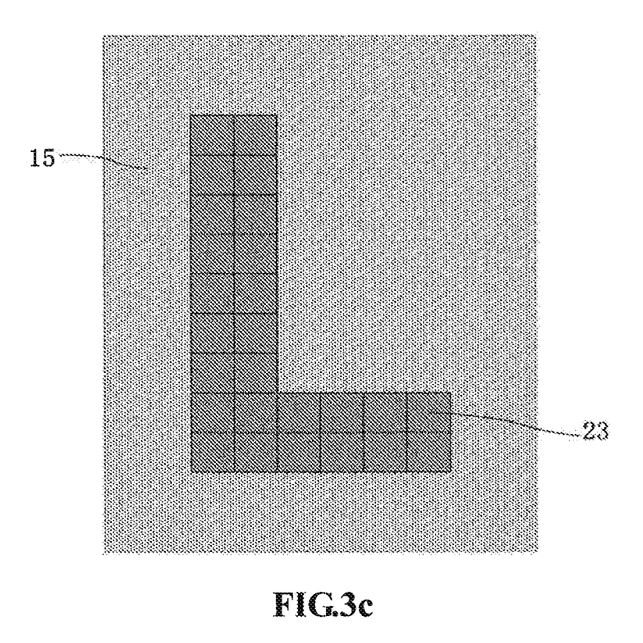
FIG. 3c is a schematic structural diagram illustrating one layer of cross section of the L-shaped device manufactured on a light-sensitive material provided by the embodiment 2 of the present disclosure.

Specially, in micro-nano machining, when the femtosecond lasers are radiated on the dynamic image capture apparatus after being modulated by the external light path modulation unit 12 firstly, only the pixel units 222 in the opening state can transmit or reflect the femtosecond lasers. An L-shaped graph composed of a plurality of light spots is formed inside the light-sensitive material 15 after focusing by the focusing lens 14, the light-sensitive material 15 at the light spots generate two-photon polymerization, polymerization points form one layer of cross-section structure of the device, i.e. one layer of a cross-section graph 23 of the L-shaped device shown in FIG. 3c. Then, the computer 17 controls the opening/closing time of each pixel unit in the dynamic image capture apparatus, and the exposure time can be flexibly controlled, thereby improving the machining precision. The computer 17 controls the displacement platform 16 to move by a distance equal to thickness of one layer of the cross-section every time along the direction (longitudinal direction in FIG. 2a and FIG. 2b) parallel to that the femtosecond lasers radiate the light-sensitive material 15, and one entire micro-nano device can be finally obtained through layer-by-layer machining, and the whole machining process can be monitored by the monitoring apparatus 18 in real time.

The traditional micro-nano machining by two-photon polymerization adopts a single-beam point-by-point machining manner, the time for machining one layer of the cross-section part of the same L-shaped device is the sum of the machining time of all points, while through adoption of the layer-by-layer machining manner of the present disclosure, all the points of one layer of the cross-section part can be simultaneously machined, the time for machining each layer of the cross sections is approximately equivalent to the time for machining one point by the traditional manner, and the machining speed is obviously improved. The time for machining each layer of the cross sections is relevant to the response time of the dynamic image capture apparatus and the exposure time of the light-sensitive material, and the opening and closing switching speed of the each pixel unit is very high, thereby precisely controlling the exposure time and being conductive to improving the machining resolution. Additionally, since the dynamic image capture apparatus is taken as the image capture apparatus, the opening/closing state of each pixel unit on the dynamic image capture apparatus can be flexibly controlled to form any complex graph; and the dynamic image capture apparatus can machine one layer of cross section of the device at one time, and each layer of the cross-section graphs can be any complex graph. In this way, any complex three-dimensional micro-nano structure can be rapidly and flexibly machined through layer-by-layer machining.

It should be noted that, one beam transmitted or reflected by the pixel units 222 in the opening state is a minimum beam, and the size of the pixel unit determines the minimum machining size. Therefore, a minimum writing unit in the light-sensitive material 15 is actually equal to the size of the pixel unit divided by reduction times after the beams are focused, where the reduction times depend on the chosen focusing lens.

Additionally, the dynamic image capture apparatus can be selected from the existing LCD or DLP in the market or can be customized according to the minimum size required to be machined, and the smaller the size of the pixel unit of the dynamic image capture apparatus is, the higher the speed of the transmitted or reflected femtosecond lasers is, the higher the machining resolution is.

Embodiment 3

Embodiment 3 of the present disclosure also provides a system for micro-nano machining by femtosecond laser two-photon polymerization. The difference from the embodiment 2 is that the static image capture apparatus is adopted as the image capture apparatus of the present embodiment.

Figure 4:
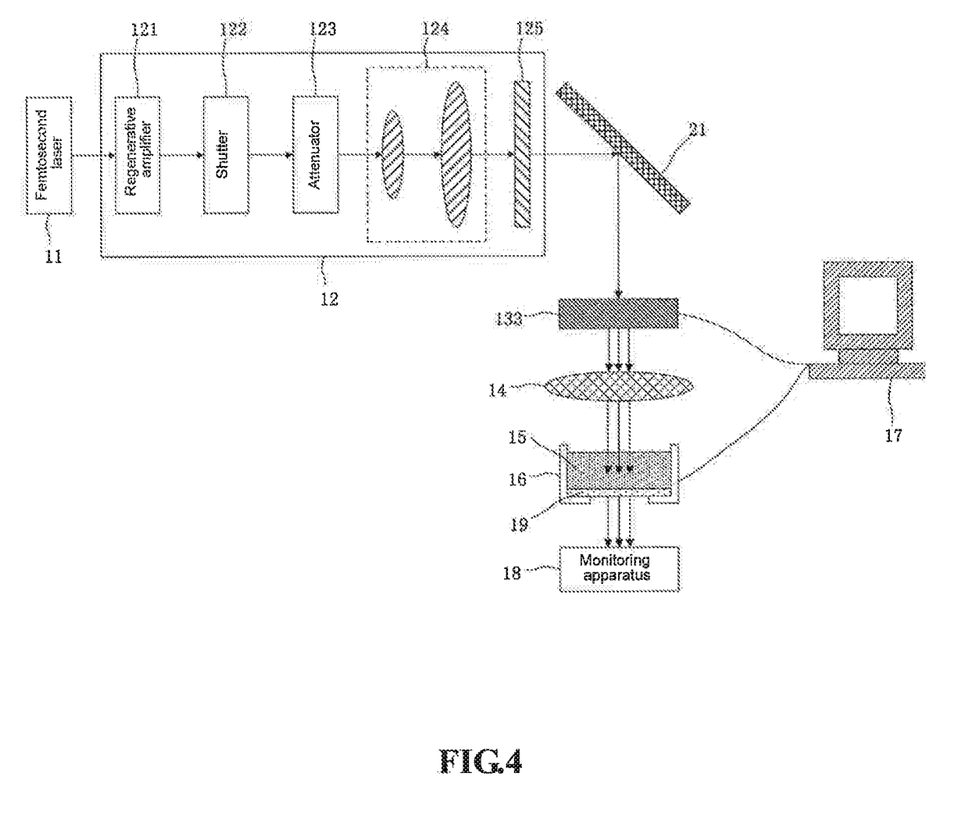
FIG. 4 is a schematic structural diagram illustrating a system for micro-nano machining by femtosecond laser two-photon polymerization provided by embodiment 3 of the present disclosure.

Further, the static image capture apparatus may be a mask plate. FIG. 4 is a schematic structural diagram illustrating the system for the micro-nano machining by femtosecond laser two-photon polymerization provided by the embodiment 3 of the present disclosure. As shown in FIG. 4, the static image capture apparatus is a mask plate 133, and in order that the structure of the whole system for the micro-nano machining is more compact, a whole reflector 21 is arranged on an advance path of femtosecond lasers and among an aperture stop 125, the mask plate 133 and an image capture apparatus 13.

In the present embodiment, the mask plate 133 may include a plurality of microcells, where each microcell includes one layer of cross-section graphs of a three-dimensional micro-nano device. It should be noted that, the size of the each microcell may be the times of the actual size of each layer of the cross sections of the micro-nano device, and the specific times depend on the focusing times of a focusing lens adopted.

In the present embodiment, further, a computer 17 is used for controlling the image capture apparatus, including: carrying out, by the computer 17, fine adjustment for the position of the mask plate 133 in the micro-nano machining process, so as to capture all layers of cross-section graphs of the three-dimensional micro-nano device.

It should be noted that, the cross-section graphs of the three-dimensional micro-nano device formed on the mask plate 133 are different from those formed on a dynamic image capture apparatus; and specifically, the mask plate 133 is manufactured according to all the layers of cross-section graphs of the three-dimensional micro-nano device designed by the computer 17. The mask plate 133 may be selected from a glass plate having high transmittance for the light source of the femtosecond lasers, and all the layers of the cross-section graphs of the device are respectively manufactured on the surface of the glass plate. In each microcell, metal graphs are manufactured on the surface of the glass by a micro-nano machining technology (such as evaporation or sputtering, photoetching, wet etching and the like), the region covered by metals does not transmit the femtosecond lasers, and the region not covered by metals transmits the femtosecond lasers. Each transmitting region corresponds to all points on all the layers of the cross-section graphs of the device, the area of each transmitting region is equal to the times of the corresponding points, and the specific enlargement times are determined according to the focusing times of the focusing lens. Meanwhile, collimating marks are manufactured in each microcell on the surface of the glass and are used for positioning each microcell.

Next, the micro-nano machining by taking the mask plate as the image capture apparatus is further described. During the micro-nano machining, the femtosecond lasers are radiated on the mask plate 133 of the static image capture apparatus after being modulated by an external light path modulation unit 12 firstly. Since the mask plate 133 is connected with the computer 17, the mask plate 133 is adjusted by the computer 17, so that the femtosecond lasers are in alignment to the region on the mask plate 133, which corresponds to a first layer of cross-section graphs of the device, one beam transmits the transmitting regions and forms a plurality of beams in a space at the other side of the mask plate 133, a planar graph composed of a plurality of focal points is formed in a light-sensitive material 15 after focusing of a focusing lens 14, and the light-sensitive material at all the focal points generate two-photon polymerization and are solidified, so that a plurality of solidification points form a first layer of cross-section structures of the device. Then, the computer 17 controls a displacement platform 16 to move a distance of thickness of one layer (as shown in FIG. 4) longitudinally; meanwhile, the computer 17 adjusts the position of the mask plate 133, so that the femtosecond lasers are in alignment to the microcell on the mask plate 133, which corresponds to a second layer of cross-section graphs of the device, and the second layer of a cross-section structure of the device is formed through machining. Successively, the entire three-dimensional micro-nano device is finally obtained by layer-by-layer polymerization, and the whole machining process can be observed by a monitoring apparatus 18 in real time.

It should be noted that, the layer-by-layer micro-nano machining is carried out by the mask plate 133. Additionally, multifocal parallel micro-nano machining may also be carried out by the mask plate 133, and a plurality of three-dimensional micro-nano devices can be simultaneously machined. Under this situation, each microcell of the mask plate 133 is provided with a plurality of transmitting regions, and each microcell corresponds to each three-dimensional micro-nano device to be manufactured. During the micro-nano machining, the femtosecond lasers are radiated on the mask plate 133 after being modulated by the external light path modulation unit 12 firstly, a plurality of parallel beams are formed through transmitting, and each beam of femtosecond lasers is composed of beams transmitted by the transmitting regions in each microcell. A plurality of light spots are formed inside the light-sensitive material 15 after focusing of the focusing lens 14, and the light-sensitive material at all the focal points generate two-photon polymerization. The computer 17 controls the displacement platform 16 to move according to a preset track, a plurality of micro-nano devices can be simultaneously and parallelly machined, and the whole machining process can be monitored by the monitoring apparatus 18 in real time.

With the development of a photolithography, a manufacturing technology for an optical mask plate also makes great progress, so that various graphs can be easily manufactured on the surface of a glass substrate by various photolithographies, and the manufacturing cost is low.

In the technical solution of the present embodiment, through one-time image capturing and forming for each layer of the cross sections of the device by the mask plate which is taken as the static image capture apparatus, the machining efficiency is obviously improved; and meanwhile, the manufacturing process for the mask plate is mature, and each transmitting region in the microcells can realize zero interval. Therefore, a structure of a smooth three-dimensional micro-nano device can be machined by image capture of the mask plate.

Embodiment 4

Embodiment 4 of the present disclosure provides a method for micro-nano machining by femtosecond laser two-photon polymerization. The method for the micro-nano machining by femtosecond laser two-photon polymerization of the embodiment is executed by the systems for the micro-nano machining by femtosecond laser two-photon polymerization described by above embodiments, and the explanation of concepts and the description for relevant principles in the embodiment can be seen from above embodiments and are not repeated here.

Figure 5:
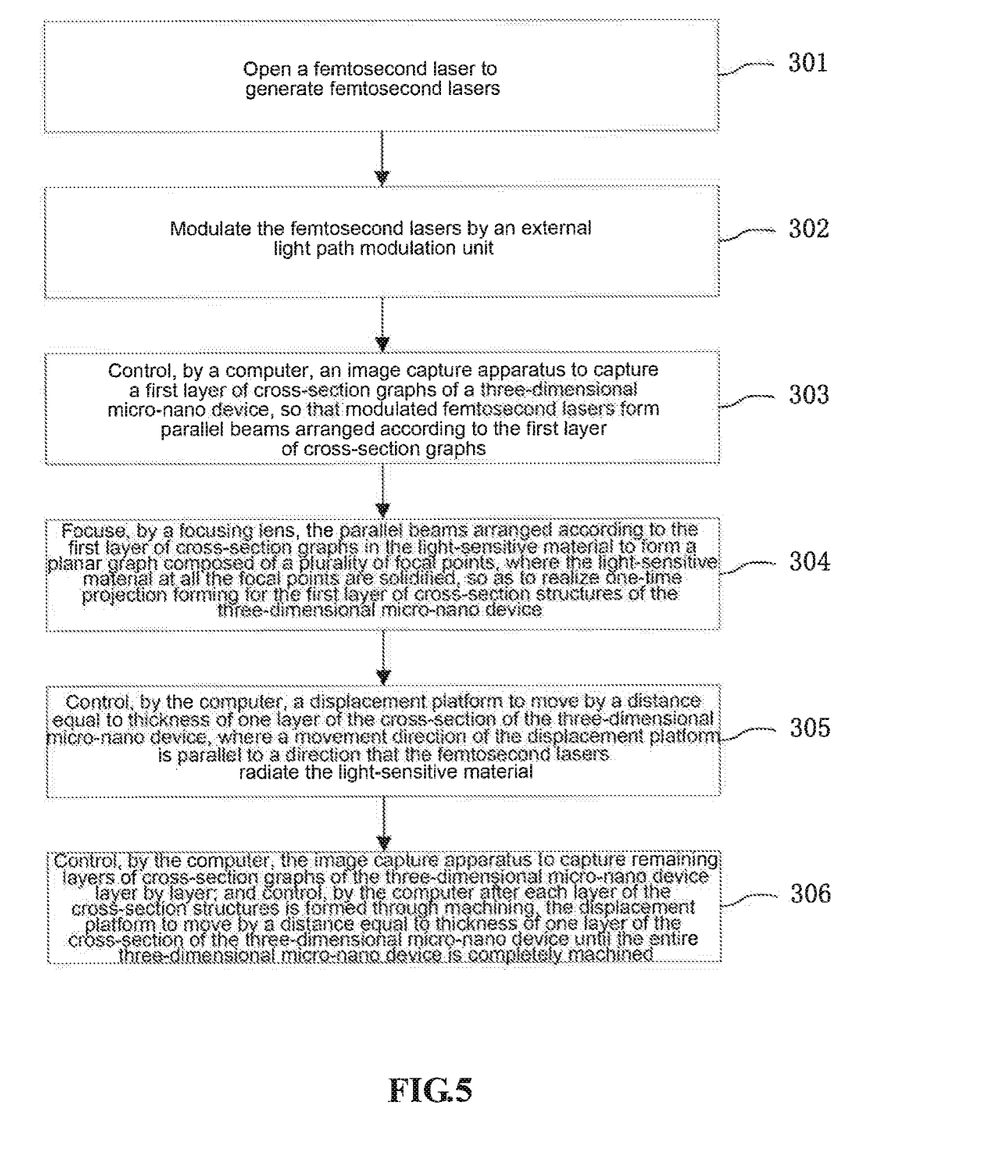
FIG. 5 is a flow chart illustrating a method for micro-nano machining by femtosecond laser two-photon polymerization provided by embodiment 4 of the present disclosure.

The method for the micro-nano machining by femtosecond laser two-photon polymerization described by the embodiment is used for realizing layer-by-layer micro-nano machining for a light-sensitive material, and a layer-by-layer micro-nano machining process for the light-sensitive material is monitored by a monitoring apparatus in real time. FIG. 5 is a flow chart illustrating the method for the micro-nano machining by femtosecond laser two-photon polymerization provided by the embodiment 4 of the present disclosure. As shown in FIG. 5, the method for the micro-nano machining by femtosecond laser two-photon polymerization includes following steps.

In step 301, a femtosecond laser is opened to generate femtosecond lasers;

in step 302, the femtosecond lasers are modulated by an external light path modulation unit;

further, the step of modulating, by the external light path modulation unit, the femtosecond lasers includes: the femtosecond lasers are modulated by a regenerative amplifier, a shutter, an attenuator, a collimating lens group and an aperture stop that are sequentially arranged on an advance path of the femtosecond lasers and in the external light path modulation unit;

in step 303, an image capture apparatus is controlled by a computer to capture a first layer of cross-section graphs of a three-dimensional micro-nano device, so that modulated femtosecond lasers form parallel beams arranged according to all layers of cross-section graphs;

in step 304, the parallel beams arranged according to the first layer of cross-section graphs are focused in the light-sensitive material by a focusing lens to form a planar graph composed of a plurality of focal points, where the light-sensitive material at all the focal points are solidified, so as to realize one-time projection forming for the first layer of cross-section structures of the three-dimensional micro-nano device;

in step 305, a displacement platform is controlled by the computer to move by a distance equal to thickness of one layer of the cross-section of the three-dimensional micro-nano device, where a movement direction of the displacement platform is parallel to a direction that the femtosecond lasers radiate the light-sensitive material; and in step 306, the image capture apparatus is controlled by the computer to capture remaining layers of cross-section graphs of the three-dimensional micro-nano device layer by layer; and, after each layer of the cross-section structures is formed through machining, the displacement platform is controlled by the computer to move by a distance equal to thickness of one layer of the cross-section of the three-dimensional micro-nano device until the entire three-dimensional micro-nano device is completely machined.

Further, the step of controlling, by the computer, the image capture apparatus to capture the first layer of cross-section graphs of the three-dimensional micro-nano device includes: the structure of the three-dimensional micro-nano device is modeled by the computer, a model obtained through modeling is converted into digital voltage signals to load on the dynamic image capture apparatus, and the opening/closing state of pixel units in the dynamic image capture apparatus is controlled, so as to form all the layers of cross-section graphs of the three-dimensional micro-nano device when the dynamic image capture apparatus is adopted as the image capture apparatus; or fine adjustment is carried out by the computer on the position of the static image capture apparatus in the micro-nano machining process, so as to capture all the layers of the cross-section graphs of the three-dimensional micro-nano device when the static image capture apparatus is adopted as the image capture apparatus.

According to the method for the micro-nano machining by femtosecond laser two-photon polymerization provided by the embodiment 4 of the present disclosure, the image capture apparatus is arranged in a light path for the micro-nano machining by the femtosecond lasers, so that one-time projection forming for each layer of the cross-section graphs of the manufactured device can also be realized, and all layers of the cross-section graphs may be different, in this way, any complex three-dimensional micro-nano device can be machined, so as to greatly improve the machining efficiency and the process flow. Additionally, in the layer-by-layer micro-nano machining process, the displacement platform only needs to move along the direction of the cross-section thickness of the micro-nano device and does not need to move point to point along the plane two-dimensional direction. In this way, not only the time for machining and forming for each layer of the cross sections of the three-dimensional micro-nano device is obviously shortened, so as to improve the machining efficiency and the process flow, but also the positioning precision requirement in the plane two-dimensional direction is reduced, so that the machining process is simplified, and the difficulty is reduced.

Embodiment 5

Embodiment 5 of the present disclosure provides a method for micro-nano machining by femtosecond laser two-photon polymerization. The method for the micro-nano machining by femtosecond laser two-photon polymerization of the embodiment is executed by the systems for the micro-nano machining by femtosecond laser two-photon polymerization described by embodiments 1, 2 and 3, and the explanation of concepts and the description for relevant principles in the embodiment can be seen from above embodiments 1, 2 and 3 and are not repeated here.

Figure 6:
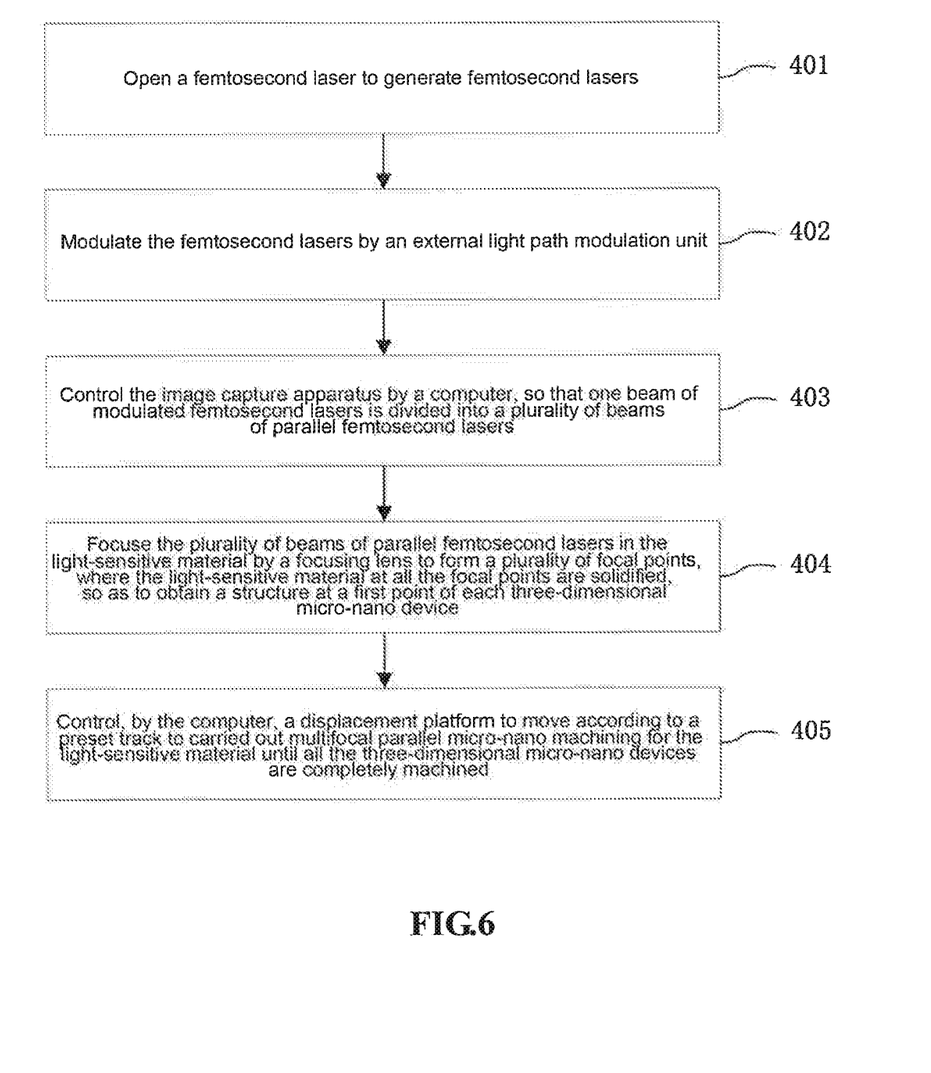
FIG. 6 is a flow chart illustrating a method for micro-nano machining by femtosecond laser two-photon polymerization provided by embodiment 5 of the present disclosure.

The method for the micro-nano machining by femtosecond laser two-photon polymerization described by the embodiment is used for carrying out multifocal parallel micro-nano machining for a light-sensitive material to manufacture a plurality of three-dimensional micro-nano devices, and the multifocal parallel micro-nano machining process for the light-sensitive material can be monitored by a monitoring apparatus in real time. It should be noted that, the difference of the present embodiment from the embodiment 4 is that the layer-by-layer micro-nano machining for the light-sensitive material is carried out by the image capture apparatus in the embodiment 4, while the multifocal parallel micro-nano machining for the light-sensitive material is carried out by an image capture apparatus in the embodiment 5. FIG. 6 is a flow chart illustrating the method for the micro-nano machining by femtosecond laser two-photon polymerization provided by the embodiment 5 of the present disclosure. As shown in FIG. 6, the method for the micro-nano machining by femtosecond laser two-photon polymerization includes following steps.

In step 401, a femtosecond laser is opened to generate femtosecond lasers;

in step 402, the femtosecond lasers are modulated by an external light path modulation unit;

in step 403, the image capture apparatus is controlled by a computer, so that one beam of modulated femtosecond lasers is divided into a plurality of beams of parallel femtosecond lasers;

in step 404, the plurality of beams of parallel femtosecond lasers are focused in the light-sensitive material by a focusing lens to form a plurality of focal points, where the light-sensitive material at all the focal points are solidified, so as to obtain a structure at a first point of each three-dimensional micro-nano device; and in step 405, a displacement platform is controlled by the computer to move according to a preset track to carried out multifocal parallel micro-nano machining for the light-sensitive material until all the three-dimensional micro-nano devices are completely machined.

In the present embodiment, the dynamic image capture apparatus may be adopted as the image capture apparatus. The dynamic image capture apparatus is adopted for micro-nano machining. Therefore, the machining speed is greatly improved, and the technological flexibility is very strong. Meanwhile, the opening and closing switching speed of each pixel unit in the dynamic image capture apparatus is as high as microseconds, thereby being conductive to further improving the machining speed and flexibly controlling the exposure time, so as to improve the machining resolution.

According to the method for the micro-nano machining by femtosecond laser two-photon polymerization provided by the embodiment 5 of the present disclosure, the image capture apparatus is arranged in the light path for the micro-nano machining by the femtosecond lasers, so that one beam of femtosecond lasers can be divided into a plurality of beams of parallel femtosecond lasers, and a plurality of three-dimensional micro-nano devices can be simultaneously machined, thereby greatly improving the machining efficiency and the process flow.

It should be noted that, the above contents are only better embodiments and technical principles applied by the present disclosure. Those skilled in the art should understand that the present disclosure is not limited to the specific embodiments described here, and those skilled in the art can make various apparent changes, readjustment and replacements without departing from the protection scope of the present disclosure. Therefore, although the present disclosure is described in detail through above embodiments, the present disclosure is not limited to above embodiments, and the present disclosure may include more other equivalent embodiments without departing from the concept of the present disclosure, while the scope of the present disclosure is determined by the scope of the attached claims.

What is claimed is:

1. A system for micro-nano machining by femtosecond laser two-photon polymerization, comprising:
    a femtosecond laser, configured to generate femtosecond lasers;
    an external light path modulation unit, configured to modulate the femtosecond lasers;
    an image capture apparatus, configured to capture cross-section graphs of a three-dimensional micro-nano device layer by layer, so that modulated femtosecond lasers form parallel beams arranged according to all layers of the cross-section graphs;
    a focusing lens, configured to focus the parallel beams arranged according to all layers of the cross-section graphs in a light-sensitive material to form a planar graph composed of a plurality of focal points, wherein the light-sensitive material at all the focal points are lighted to achieve solidified light-sensitive material, so as to realize a cross-section structure of each layer in the three-dimensional micro-nano device through one-time projection forming;
    a displacement platform, configured to carry out fine adjustment for position of the light-sensitive material placed on the displacement platform;
    a computer, configured to control the displacement platform and the image capture apparatus; and
    a monitoring apparatus, configured to monitor a micro-nano machining process for the light-sensitive material in real time;
    wherein the image capture apparatus is a dynamic image capture apparatus, wherein the dynamic image capture apparatus comprises a plurality of pixel units;
    and wherein each pixel unit in the plurality of pixel units of the dynamic image capture apparatus is separately opened or closed under control of the computer, and when the femtosecond lasers are radiated on the dynamic image capture apparatus, pixel units in the opening state reflect or transmit femtosecond lasers, and one beam of femtosecond lasers is divided into a plurality of beams of femtosecond lasers arranged according to a specific shape for micro-nano machining.

2. The system according to claim 1, wherein the dynamic image capture apparatus is a Liquid Crystal Display LCD or a Digital Light Procession DLP.

3. The system according to claim 1, wherein the controlling the image capture apparatus by the computer comprises: modeling, by the computer, for the structure of the three-dimensional micro-nano device, converting a model obtained through the modeling into digital voltage signals to load on the dynamic image capture apparatus, so as to form all layers of cross-section graphs of the three-dimensional micro-nano device on the dynamic image capture apparatus.

4. The system according to claim 3, wherein pixel units in an opening state under control of the computer form all the layers of the cross-section graphs of the three-dimensional micro-nano device on the dynamic image capture apparatus.

5. The system according to claim 1, wherein the external light path modulation unit comprises a regenerative amplifier, a shutter, an attenuator, a collimating lens group and an aperture stop that are sequentially arranged on an advance path of the femtosecond lasers.

6. A method for micro-nano machining by femtosecond laser two-photon polymerization, executed by the system for the micro-nano machining by femtosecond laser two-photon polymerization of claim 1, wherein the method is used for layer-by-layer micro-nano machining for a light-sensitive material, and a layer-by-layer micro-nano machining process for the light-sensitive material is monitored by the monitoring apparatus in real time, and the method comprises:

opening the femtosecond laser to generate femtosecond lasers;

modulating the femtosecond lasers by the external light path modulation unit;

controlling, by the computer, the image capture apparatus to capture a first layer of cross-section graphs of the three-dimensional micro-nano device, so that the modulated femtosecond lasers form parallel beams arranged according to the first layer of cross-section graphs;

focusing, by the focusing lens, the parallel beams arranged according to the first layer of cross-section graphs in the light-sensitive material to form a planar graph composed of a plurality of focal points, wherein the light-sensitive material at all the focal points are lighted to achieve solidified light-sensitive material, so as to realize a cross-section structure of the first layer in the three-dimensional micro-nano device through one-time projection forming;

controlling, by the computer, the displacement platform to move by a distance equal to thickness of one layer of the cross-section of the three-dimensional micro-nano device, wherein a movement direction of the displacement platform is parallel to a direction that the femtosecond lasers radiate the light-sensitive material; and controlling, by the computer, the image capture apparatus to capture remaining layers of cross-section graphs of the three-dimensional micro-nano device layer by layer; and controlling, by the computer after each layer of the cross-section structures is formed through machining, the displacement platform to move by a distance equal to thickness of one layer of the cross-section of the three-dimensional micro-nano device until the entire three-dimensional micro-nano device is completely machined.

7. The method according to claim 6, wherein the controlling, by the computer, the image capture apparatus to capture all layers of cross-section graphs of the three-dimensional micro-nano device comprises:

modeling, by the computer, a structure of the three-dimensional micro-nano device, converting a model obtained through modeling into digital voltage signals to load on a dynamic image capture apparatus, and controlling an opening/closing state of pixel units in the dynamic image capture apparatus, so as to capture all the layers of cross-section graphs of the three-dimensional micro-nano device when the image capture apparatus is the dynamic image capture apparatus; or carrying out, by the computer, fine adjustment for position of a static image capture apparatus in a micro-nano machining process, so as to capture all the layers of the cross-section graphs of the three-dimensional micro-nano device when the image capture apparatus is the static image capture apparatus comprising all the layers of the cross-section graphs of the three-dimensional micro-nano device.

8. The method according to claim 6, wherein the modulating, by an external light path modulation unit, the femtosecond lasers comprises:

modulating the femtosecond lasers by a regenerative amplifier, shutter, attenuator, collimating lens group and aperture stop that are sequentially arranged on an advance path of the femtosecond lasers and are in the external light path modulation unit.

9. A method for micro-nano machining by femtosecond laser two-photon polymerization, executed by the system for the micro-nano machining by femtosecond laser two-photon polymerization described in claim 1, wherein the method is used for multifocal parallel micro-nano machining for a light-sensitive material to manufacture a plurality of three-dimensional micro-nano devices, and a multifocal parallel micro-nano machining process for the light-sensitive material is monitored in real time by the monitoring apparatus, and the method comprises:

opening the femtosecond laser to generate femtosecond lasers;

modulating the femtosecond lasers by the external light path modulation unit;

controlling, by the computer, the image capture apparatus to divide one beam of modulated femtosecond lasers into a plurality of beams of parallel femtosecond lasers;

focusing, by the focusing lens, the plurality of beams of parallel femtosecond lasers in the light-sensitive material to form a plurality of focal points, wherein the light-sensitive material at all the focal points are lighted to achieve solidified light-sensitive material, so as to obtain a structure of each three-dimensional micro-nano device at a first point; and controlling, by the computer, the displacement platform to move according to a preset track to carry out multifocal parallel micro-nano machining for the light-sensitive material until all the three-dimensional micro-nano devices are completely machined.

* * * * *